US011255732B2

(12) United States Patent
Cao et al.

(10) Patent No.: US 11,255,732 B2
(45) Date of Patent: Feb. 22, 2022

(54) TEMPERATURE SENSOR, ARRAY SUBSTRATE AND DISPLAY DEVICE

(71) Applicant: BOE TECHNOLOGY GROUP CO., LTD., Beijing (CN)

(72) Inventors: Xueyou Cao, Beijing (CN); Haisheng Wang, Beijing (CN); Chunwei Wu, Beijing (CN); Xiaoliang Ding, Beijing (CN); Yanling Han, Beijing (CN); ChihJen Cheng, Beijing (CN); Wei Liu, Beijing (CN); Ping Zhang, Beijing (CN); Tianhang Luan, Beijing (CN); Hao Li, Beijing (CN); Shaoning Guo, Beijing (CN); Bingqian Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 16/338,361

(22) PCT Filed: Sep. 4, 2018

(86) PCT No.: PCT/CN2018/103986
§ 371 (c)(1),
(2) Date: Mar. 29, 2019

(87) PCT Pub. No.: WO2019/072052
PCT Pub. Date: Apr. 18, 2019

(65) Prior Publication Data
US 2019/0360869 A1 Nov. 28, 2019

(30) Foreign Application Priority Data

Oct. 13, 2017 (CN) .......................... 201710952751.7

(51) Int. Cl.
*G01K 7/00* (2006.01)
*G01K 1/02* (2021.01)
(Continued)

(52) U.S. Cl.
CPC ............... *G01K 1/028* (2013.01); *G01K 7/00* (2013.01); *G01K 15/005* (2013.01); *H03K 3/0315* (2013.01)

(58) Field of Classification Search
CPC ........ G01K 1/028; G01K 7/00; G01K 15/005; G01K 7/32; G01K 7/01; G01K 2219/00;
(Continued)

(56) References Cited

U.S. PATENT DOCUMENTS 4,302,732 A 11/1981 Moulton et al.
4,549,818 A 10/1985 Nishikubo et al.
(Continued)

FOREIGN PATENT DOCUMENTS

CN 1973439 A 5/2007
CN 103427836 A 12/2013
(Continued)

OTHER PUBLICATIONS

International Search Report dated Nov. 22, 2018 corresponding to application No. PCT/CN2018/103986.
(Continued)

*Primary Examiner* — Gail Kaplan Verbitsky
(74) *Attorney, Agent, or Firm* — Nath, Goldberg & Meyer; Joshua B. Goldberg (57) ABSTRACT

Provided are a temperature sensor, an array substrate, and a display device. In the temperature sensor, a low-pass filter is disposed between a ring oscillator and a comparator, so that a square-wave signal output from the ring oscillator passes through the low-pass filter and a high-frequency component in the square-wave signal output from the ring oscillator is
(Continued)

directly filtered out by the low-pass filter, thereby improving a signal-to-noise ratio of the ring oscillator and a test accuracy of the temperature sensor.

12 Claims, 4 Drawing Sheets

(51) Int. Cl.
  *G01K 15/00* (2006.01)
  *H03K 3/03* (2006.01)
(58) Field of Classification Search
  CPC ........ G01K 7/203; G01K 17/00; G01K 7/245; G01K 7/346; H03K 3/0315; H03K 2005/00071; H03K 5/134; H03K 7/06
  USPC .......................................................... 331/57
  See application file for complete search history.

(56) References Cited

U.S. PATENT DOCUMENTS

| | | | | |
|---|---|---|---|---|
| 5,331,295 | A | 7/1994 | Jelinek et al. | |
| 5,600,281 | A | 2/1997 | Mori et al. | |
| 6,650,191 | B2 | 11/2003 | Branch et al. | |
| 6,934,652 | B2 | 8/2005 | Gauthier et al. | |
| 7,245,114 | B2* | 7/2007 | Chu ...................... | H02M 3/156 |
| | | | | 323/282 |
| 7,365,453 | B2* | 4/2008 | Large ...................... | C02F 1/008 |
| | | | | 307/115 |
| 7,831,873 | B1* | 11/2010 | Trimberger .............. | G01K 7/32 |
| | | | | 714/725 |
| 8,384,086 | B2* | 2/2013 | Yamayoshi ............. | H01L 29/04 |
| | | | | 257/69 |
| 8,967,856 | B2* | 3/2015 | Bruset ...................... | G01K 7/32 |
| | | | | 374/117 |
| 9,148,131 | B2* | 9/2015 | Guo ........................ | H03K 19/20 |
| 2002/0118073 | A1 | 8/2002 | Diewald | |
| 2005/0110583 | A1 | 5/2005 | Deas et al. | |
| 2005/0141589 | A1 | 6/2005 | Kwon et al. | |
| 2005/0180488 | A1* | 8/2005 | Rusu ...................... | G06F 1/324 |
| | | | | 374/141 |
| 2009/0109782 | A1 | 4/2009 | Chen | |
| 2011/0079780 | A1* | 4/2011 | Yamayoshi ............. | H01L 29/04 |
| | | | | 257/57 |
| 2012/0051395 | A1 | 3/2012 | Chen et al. | |
| 2013/0027371 | A1* | 1/2013 | Saitoh .................... | H04N 9/643 |
| | | | | 345/207 |
| 2014/0119403 | A1* | 5/2014 | Moon ...................... | G01K 7/32 |
| | | | | 374/117 |
| 2014/0294042 | A1* | 10/2014 | Bruset ...................... | G01K 7/32 |
| | | | | 374/117 |
| 2018/0150031 | A1* | 5/2018 | Caffee ...................... | G01K 7/01 |
| 2019/0094077 | A1* | 3/2019 | Wang ...................... | H03K 5/24 |
| 2020/0209070 | A1* | 7/2020 | Tang ........................ | G01K 7/32 |
| 2020/0313664 | A1* | 10/2020 | Azam ...................... | G01K 7/01 |

FOREIGN PATENT DOCUMENTS

| | | | | |
|---|---|---|---|---|
| CN | 104596662 | A | 5/2015 | |
| CN | 105043580 | A | 11/2015 | |
| CN | 105958971 | A | 9/2016 | |
| CN | 106875878 | A | 6/2017 | |
| CN | 107112958 | A | 8/2017 | |
| CN | 107830940 | A | 3/2018 | |
| DE | 2934073 | C2 | 1/1986 | |
| JP | S62296623 | A | 12/1987 | |
| JP | H5136693 | A | 6/1993 | |
| JP | H10239097 | A | 9/1998 | |
| WO | WO2019072052 | A | * 4/2019 | |
| WO | WO-2019072052 | A1 | * 4/2019 | ........... H03K 3/0315 |

OTHER PUBLICATIONS

First Office Action dated Feb. 20, 2019 corresponding to Chinese application No. 201710952751.7.
Rejection dated Aug. 6, 2019 corresponding to Chinese application No. 201710952751.7.

* cited by examiner

TEMPERATURE SENSOR, ARRAY SUBSTRATE AND DISPLAY DEVICE

CROSS-REFERENCE TO RELATED APPLICATIONS

This is a National Phase Application filed under 35 U.S.C. 371 as a national stage of PCT/CN2018/103986, filed on Sep. 4, 2018, an application which claims the priority of the Chinese Patent Application No. 201710952751.7 filed on Oct. 13, 2017, the contents of each is incorporated herein by reference in its entirety.

TECHNICAL FIELD

The present disclosure relates to the field of sensor technology, and in particular, to a temperature sensor, an array substrate, and a display device.

BACKGROUND

A multi-stage ring oscillator is typically manufactured by using TFTs, and a temperature value is measured by detecting an output frequency of the multi-stage ring oscillator.

SUMMARY

Embodiments of the present disclosure provide a temperature sensor, an array substrate, and a display device.

At least one embodiment of the present disclosure provides a temperature sensor, the temperature sensor includes: a ring oscillator, a comparator, a low-pass filter disposed between the ring oscillator and the comparator, and a signal converter, the ring oscillator is configured to output a square-wave signal; the low-pass filter is configured to filter out a high-frequency component in the square-wave signal output from the ring oscillator and output the filtered square-wave signal to the comparator; the comparator is configured to compare a filtered square-wave signal input to the comparator with a reference signal, and output a comparison square-wave signal; and the signal converter is coupled to the comparator and configured to convert the comparison square-wave signal output from the comparator to a temperature value.

In some embodiments, the low-pass filter includes a first capacitor; a first end of the first capacitor is coupled to an output terminal of the ring oscillator and a first input terminal of the comparator; and a second end of the first capacitor is grounded.

In some embodiments, the low-pass filter includes a second capacitor and a third transistor; a first end of the second capacitor is coupled to a drain electrode of the third transistor and a first input terminal of the comparator; and a second end of the second capacitor is grounded; and a gate electrode of the third transistor is coupled to a first-level signal terminal, and a source electrode of the third transistor is coupled to an output terminal of the ring oscillator.

In some embodiments, the low-pass filter includes a third capacitor and a sixth transistor; a first end of the third capacitor is coupled to a drain electrode of the sixth transistor and a first input terminal of the comparator, and a second end of the third capacitor is grounded; and a gate electrode of the sixth transistor is coupled to a high-level signal terminal, and a source electrode of the sixth transistor is coupled to an output terminal of the ring oscillator.

In some embodiments, the low-pass filter includes a fourth capacitor and a first resistor; a first end of the fourth capacitor is coupled to a second end of the first resistor and a first input terminal of the comparator, and a second end of the fourth capacitor is grounded; and a first end of the first resistor is coupled to an output terminal of the ring oscillator.

In some embodiments, the ring oscillator includes n stages of ring oscillation circuits, where n is an odd number greater than or equal to 5; and each stage of ring oscillation circuit includes at least one first transistor and at least one second transistor.

In some embodiments, at each stage of ring oscillation circuit, a gate electrode and a source electrode of a first transistor are coupled to a first-level signal terminal, and a drain electrode of the first transistor is coupled to a source electrode of a second transistor at a same stage of ring oscillation circuit; a gate electrode of a second transistor at a first stage of ring oscillation circuit is coupled to a first input terminal of the comparator, a gate electrode of a second transistor at each of the remaining stages of ring oscillation circuits of the n stages of ring oscillation circuits other than the first stage of ring oscillation circuit is coupled to a source electrode of a second transistor at an immediately previous adjacent stage of ring oscillation circuit and a drain electrode of a first transistor at the immediately previous adjacent stage of ring oscillation circuit, and a drain electrode of the second transistor at each stage of ring oscillation circuit is coupled to a second-level signal terminal; and a source electrode of a second transistor at a $n^{th}$ stage of ring oscillation circuit and a drain electrode of a first transistor at the $n^{th}$ stage of ring oscillation circuit are coupled to an input terminal of the low-pass filter.

In some embodiments, the low-pass filter includes a first capacitor; a first end of the first capacitor is coupled to the source electrode of the second transistor at the $n^{th}$ stage of ring oscillation circuit and the drain electrode of the first transistor at the $n^{th}$ stage of ring oscillation circuit and the first input terminal of the comparator; and a second end of the first capacitor is grounded.

In some embodiments, the low-pass filter includes a second capacitor and a third transistor; a first end of the second capacitor is coupled to a drain electrode of the third transistor and the first input terminal of the comparator; and a second end of the second capacitor is grounded; and a gate electrode of the third transistor is coupled to the first-level signal terminal, and a source electrode of the third transistor is coupled to the source electrode of the second transistor at the $n^{th}$ stage of ring oscillation circuit and the drain electrode of the first transistor at the $n^{th}$ stage of ring oscillation circuit.

In some embodiments, the low-pass filter includes a third capacitor and a sixth transistor; a first end of the third capacitor is coupled to a drain electrode of the sixth transistor and the first input terminal of the comparator, and a second end of the third capacitor is grounded; and a gate electrode of the sixth transistor is coupled to a high-level signal terminal, and a source electrode of the sixth transistor is coupled to the source electrode of the second transistor at the $n^{th}$ stage of ring oscillation circuit and the drain electrode of the first transistor at the $n^{th}$ stage of ring oscillation circuit.

In some embodiments, the low-pass filter includes a fourth capacitor and a first resistor; a first end of the fourth capacitor is coupled to a second end of the first resistor and the first input terminal of the comparator, and a second end of the fourth capacitor is grounded; and a first end of the first resistor is coupled to the source electrode of the second transistor at the $n^{th}$ stage of ring oscillation circuit and the drain electrode of the first transistor at the $n^{th}$ stage of ring oscillation circuit.

In some embodiments, the temperature sensor further includes a pre-oscillation circuit having a fourth transistor and a fifth transistor, wherein a gate electrode of the fourth transistor is coupled to a first input terminal of the comparator, a source electrode of the fourth transistor is coupled to a third-level signal terminal, and a drain electrode of the fourth transistor is coupled to a gate electrode of a second transistor at a first stage of ring oscillation circuit and a source electrode of the fifth transistor; and a drain electrode of the fifth transistor is coupled to a fourth-level signal terminal, and a gate electrode of the fifth transistor is coupled to a fifth-level signal terminal.

In some embodiments, the signal converter includes: a buffer coupled to the comparator and configured to convert the comparison square-wave signal output from the comparator to an identifiable voltage signal; and a digital signal processor coupled to the buffer and configured to process the identifiable voltage signal output from the buffer and output the temperature value.

According to an aspect of the disclosure, an array substrate is provided. The array substrate includes the temperature sensor described above, and includes a display region and a frame region at an edge of the display region. The temperature sensor is disposed in the frame region, and display transistors are disposed in the display region.

According to an aspect of the disclosure, a display device including the array substrate described above is provided.

DETAILED DESCRIPTION

In order to enable those skilled in the art to better understand the technical solutions of the present disclosure, the present disclosure will be further described in detail below in conjunction with the drawings and specific embodiments.

Figure 1:
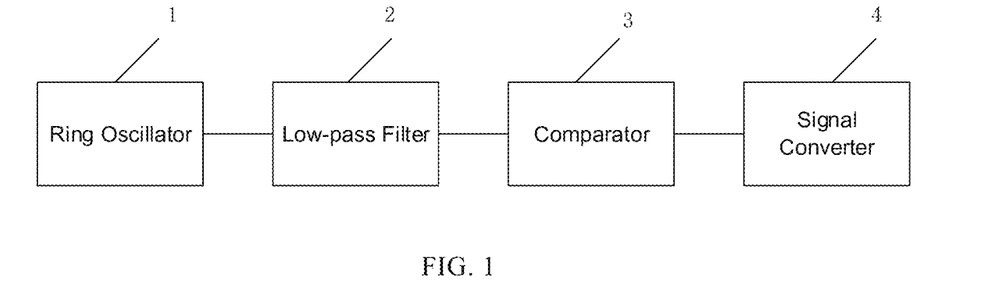
FIG. 1 is a schematic diagram illustrating a structure of a temperature sensor according to an embodiment of the present disclosure.

FIG. 1 is a schematic diagram illustrating a structure of a temperature sensor according to an embodiment of the present disclosure. As shown in FIG. 1, the temperature sensor includes a ring oscillator 1, a comparator 3, a low-pass filter 2 and a signal converter 4. The ring oscillator 1 is configured to output a square-wave signal. The low-pass filter 2 is disposed between the ring oscillator 1 and the comparator 3, and used for filtering out (i.e. removing) a high-frequency component in the square-wave signal output from the ring oscillator 1 to obtain a filtered square-wave signal and output the filtered square-wave signal to the comparator 3. The comparator 3 compares the filtered square-wave signal input to the comparator 3 with a reference signal and then output a comparison square-wave signal. The signal converter 4 is coupled to the comparator 3 and used for converting the comparison square-wave signal output from the comparator 3 into a temperature value.

In the temperature sensor according to the embodiment, the low-pass filter 2 is disposed between the ring oscillator 1 and the comparator 3, so that the square-wave signal output from the ring oscillator 1 passes through the low-pass filter 2, and the low-pass filter 2 directly filters out (i.e. removes) the high-frequency component from the square-wave signal output from the ring oscillator 1, thereby improving a signal-to-noise ratio of the ring oscillator 1 and a test accuracy of the temperature sensor.

Figure 2:
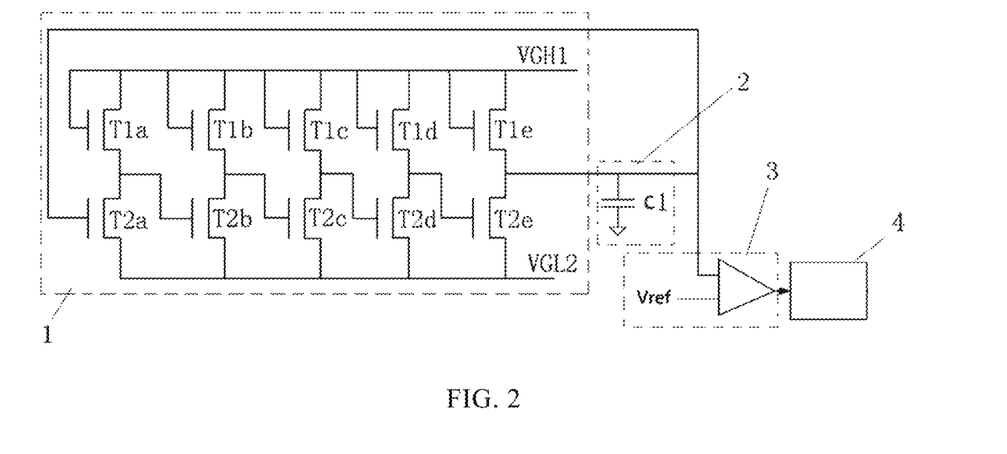
FIG. 2 to FIG. 7 are schematic diagrams illustrating structures of temperature sensors according to embodiments of the present disclosure, respectively.

FIG. 2 is a schematic diagram illustrating a structure of a temperature sensor according to an embodiment of the present disclosure. As shown in FIG. 2, the temperature sensor may include a ring oscillator 1, a comparator 3, a low-pass filter 2 and a signal converter 4. The low-pass filter 2 is provided between the ring oscillator 1 and the comparator 3, and the signal converter 4 is coupled to the comparator 3. The ring oscillator 1 is configured to output a square-wave signal. The comparator 3 compares a square-wave signal input to the comparator 3 with a reference signal and output a comparison square-wave signal. The low-pass filter 2 may filter out a high-frequency component in the square-wave signal output from the ring oscillator and output a filtered square-wave signal to the comparator 3. The signal converter 4 may convert the comparison square-wave signal output from the comparator 3 into a temperature value. Specifically, the ring oscillator 1 may include n stages of ring oscillation circuits, where n is an odd number greater than or equal to 5. Each stage of ring oscillation circuit may include one first transistor T1 and one second transistor T2. The first transistor T1 is a normally-on transistor, and the second transistor T2 is a temperature-related transistor.

FIG. 2 shows a five-stage ring oscillator 1 including five first transistors T1 and five second transistors T2: transistors T1a and T2a at a first stage, transistors T1b and T2b at a second stage, transistors T1c and T2c at a third stage, transistors T1d and T2d at a fourth stage, and transistors T1e and T2e at a fifth stage from left to right in FIG. 2. Gate electrodes of the five first transistors T1 are coupled to a first-level signal terminal VGH1, so that the first transistors T1 are always turned on to be at ON state. Second transistors T2 each may generate a leakage current due to temperature influence. The higher the temperature is, the larger the leakage current of the second transistor T2 will be. As such, the first transistors T1 that are normally turned on and the second transistors T2 may form an inverter, that is, a multi-stage ring oscillator 1. Specifically, in a case that the first-level signal terminal VGH1 is at a high level, the first transistor T1a at the first stage is turned on. The second transistor T2a at the first stage may generate the leakage current duo to the temperature influence, so that a signal that passes through the first transistor T1a at the first stage passes through the second transistor T2b at the first stage and is input to a low-level terminal VGL2. That is to say, a source electrode of the second transistor T2a at the first stage is at a low level after undergoing electric leakage, and the second transistor T2b at the second stage is turned off. Since a source electrode of the second transistor T2b at the second stage is at a high level, a second transistor T2c at the third stage is turned on. A source electrode of second transistor T2c is at a low level, and thus the second transistor T2d at the fourth stage is turned off. The second transistor T2d at the fourth stage is at a high level, and thus the second transistor T2e at the fifth stage is turned on. A source electrode of the second transistor T2e at the fifth stage is at a low level, that is, the ring oscillator 1 outputs a low-level signal.

Thereafter, the low-level signal is applied to a gate electrode of the second transistor T2a at the first stage, such that the second transistor T2a at the first stage is turned off. A source of the first transistor T1a at the first stage is at a high level, and thus the second transistor T2b at the second stage is turned on. A drain electrode of the first transistor T1b at the second stage is at a low level, and thus the second transistor T2c at the third stage is turned off. A drain electrode of the first transistor T1c at the third stage is at a high level, and thus the second transistor T2d at the fourth stage is turned on. A drain electrode of the first transistor T1d at the fourth stage is at a low level, and thus the second transistor T2e at the fifth stage is turned off, and the drain electrode of the first transistor T1e at the fifth stage is at a high level, that is, the ring oscillator 1 outputs a high-level signal, thereby realizing that the ring oscillator 1 can output oscillation signals with high and low levels, that is, the ring oscillator can output a square-wave signal. In the embodiment, the five-stage ring oscillator 1 is described as an example. It can be understood that the ring oscillator 1 with more stages is similar to those in the present embodiment, and the details thereof is omitted herein.

In an embodiment, the gate electrode and source electrode of the first transistor T1 at each stage are coupled to the first-level signal terminal VGH1, and a drain electrode of the first transistor T1 at each stage is coupled to a source electrode of the second transistor T2 at the same stage. The gate electrode of the second transistor T2a at the first stage is coupled to a first input terminal of the comparator 3. Each of the gate electrodes of the remaining second transistors T2b, T2c, T2d, and T2e except the second transistor T2a at the first stage is coupled to a source electrode of the second transistor T2 at the immediately previous stage and a drain electrode of the first transistor T1 at the immediately previous stage. A drain electrode of the second transistor T2 at each stage is coupled to a second-level signal terminal VGL2. A source electrode of the second transistor T2e at the fifth stage and a drain electrode of first transistor T1e at the fifth stage are coupled to an input terminal of the low-pass filter 2.

In an embodiment, as shown in FIG. 2, the low-pass filter 2 includes a first capacitor C1. A first end of the first capacitor C1 is coupled to the source electrode of the second transistor T2e at the fifth stage, the drain electrode of the first transistor T1e at the fifth stage, and the first input terminal of the comparator 3. A second end of the first capacitor C1 is grounded.

Referring to FIG. 2, the low-pass filter 2 includes one first capacitor C1 such that a self-resistance of the ring oscillator and the first capacitor C1 may form a passive RC first-order low-pass filter. That is to say, the low-pass filtering is realized through the capacitance to ground. The capacitance to ground and the self-resistance of ring oscillator 1 may constitute a low-pass filter 2 capable of realizing a function of filtering, thereby achieving optimization of the output signal.

Figure 3:
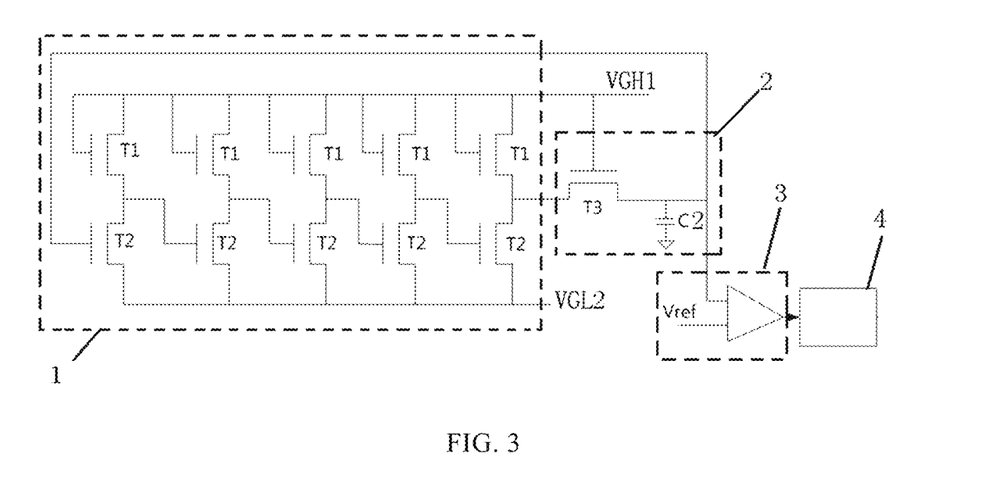

FIG. 3 is a schematic diagram illustrating a structure of a temperature sensor according to an embodiment of the present disclosure. The other components are the same as those in the embodiment shown in FIG. 2, except that the low-pass filter 2 is different from that in the embodiment of FIG. 2, and thus detailed description thereof is omitted. Referring to FIG. 3, the low-pass filter 2 includes a second capacitor C2 and a third transistor T3. A first end of the second capacitor C2 is coupled to a drain electrode of the third transistor T3 and the first input terminal of the comparator 3. A second end of the second capacitor C2 is coupled to the ground. A gate electrode of the third transistor T3 is coupled to the first-level signal terminal VGH1, and a source electrode of the third transistor T3 is coupled to the source electrode of the second transistor T2 at the $n^{th}$ stage and the drain electrode of the first transistor T1 at the $n^{th}$ stage.

Referring to FIG. 3, the low-pass filter 2 is composed of the second capacitor C2 and the third transistor T3. The ring oscillator 1 outputs a square-wave signal to the transistor T3, and thus the transistor T3 is always turned on. In this case, the third transistor T3 is served as a fixed resistor. The self-resistance value of the normally-on transistor T3 is several megaohms, and the capacitance value of the second capacitor C2 is several pFs. The formula for calculating a frequency of the low-pass filter circuit is $F=½ \pi RC$, where F is a cutoff frequency of the low-pass filter, R is a resistance value of the low-pass filter, and C is a capacitance value of the low-pass filter. The cutoff frequency of the low-pass filter 2 can be adjusted by changing the magnitude of the capacitance value. After the signal passes through the low-pass filter 2, the filtered signal is input to the comparator 3 and is compared with a reference voltage Vref. And then, a square-wave signal is output from the comparator 3. The frequency test is realized by performing a process on the square-wave signal so as to obtain an actually-measured temperature value.

Figure 4:
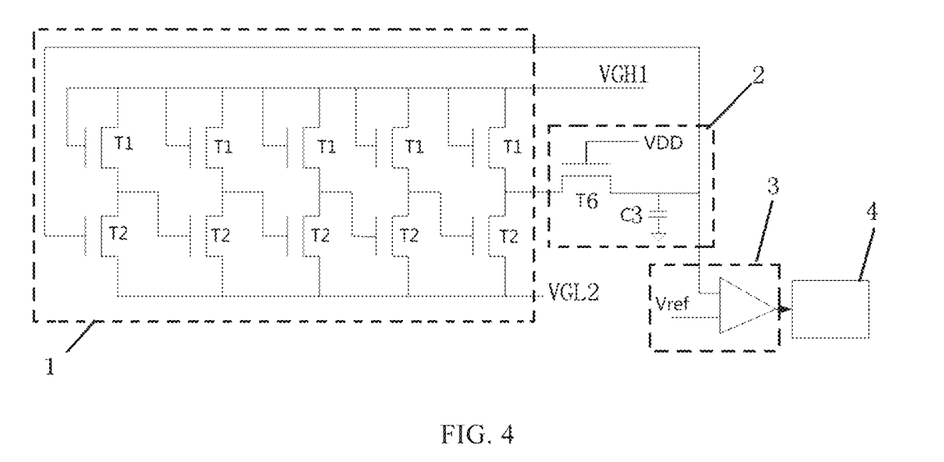

FIG. 4 is a schematic diagram illustrating a structure of a temperature sensor according to an embodiment of the present disclosure. The other components are the same as those in the embodiments shown in FIGS. 2 and 3, except that the low-pass filter 2 is different from those in the embodiments of FIGS. 2 and 3, therefore the detail description thereof is omitted. As shown in FIG. 4, the low-pass filter 2 includes a third capacitor C3 and a sixth transistor T6. A first end of the third capacitor C3 is coupled to a drain electrode of the sixth transistor T6 and the first input terminal of the comparator 3. A second end of the third capacitor C3 is coupled to the ground. A gate electrode of the sixth transistor T6 is coupled to a high-level signal terminal, and a source electrode of the sixth transistor T6 is coupled to the source electrode of the second transistor T2 at the $n^{th}$ stage and the drain electrode of the first transistor T1 at the $n^{th}$ stage.

Referring to FIG. 4, the low-pass filter 2 is similar to that in FIG. 3, except that a nominal voltage VDD supplied from outside is applied to the gate electrode of the transistor T6. The self-resistance of the sixth transistor T6 is controlled according to the gate voltage VDD, thereby adjusting the cutoff frequency of the low-pass filter. Specifically, in a case that the gate voltage VDD is changed, an equivalent resistance value of the transistor T6 changes with the gate voltage VDD. The equivalent resistance value of the transistor T6 is the resistance value of the low-pass filter. According to $F=½ \pi RC$, the cutoff frequency F is adjusted with the change of the equivalent resistance of the transistor T6.

Figure 5:
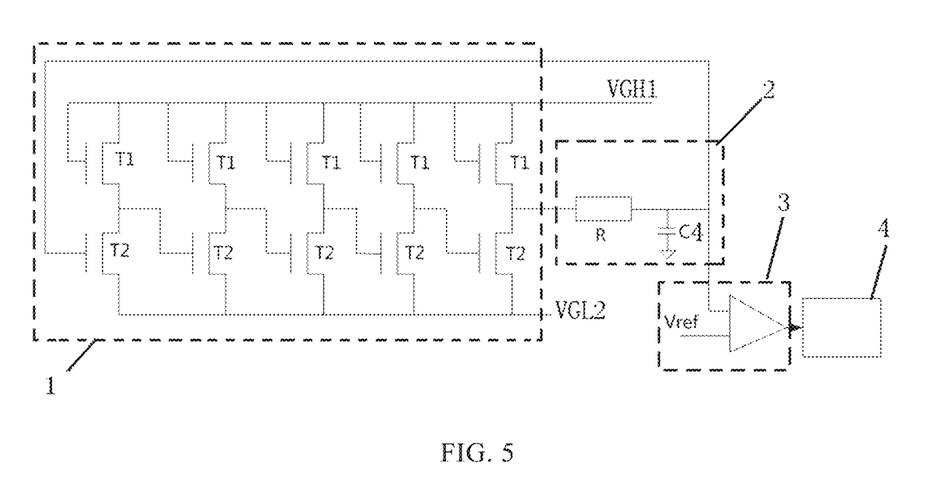

FIG. 5 is a schematic diagram illustrating a structure of a temperature sensor according to an embodiment of the present disclosure. The other components are the same as those in the embodiments shown in FIGS. 2 and 3, except that the low-pass filter 2 is different from that in the embodiments of FIGS. 2 and 3, therefore the detail description thereof is omitted. As shown in FIG. 5, the low-pass filter 2 includes a fourth capacitor C4 and a first resistor R. A first end of the fourth capacitor C4 is coupled to a second end of the first resistor R and the first input terminal of the comparator 3. A second end of the fourth capacitor C4 is grounded. A first end of the first resistor R is coupled to the source electrode of the second transistor T2 at the $n^{th}$ stage and the drain electrode of the first transistor T1 at the $n^{th}$ stage.

Referring to FIG. 5, the low-pass filter 2 in FIG. 5 is similar to the low-pass filter 2 of FIG. 3, except that an ITO circuit with relatively large impedance designed as the resistor R is provided at the output terminal of the ring oscillator 1 so as to implement a function of filtering.

In an embodiment, the temperature sensor may further include an oscillation starter circuit configured to improve the oscillation starting performance of the ring oscillator 1.

Figure 6:
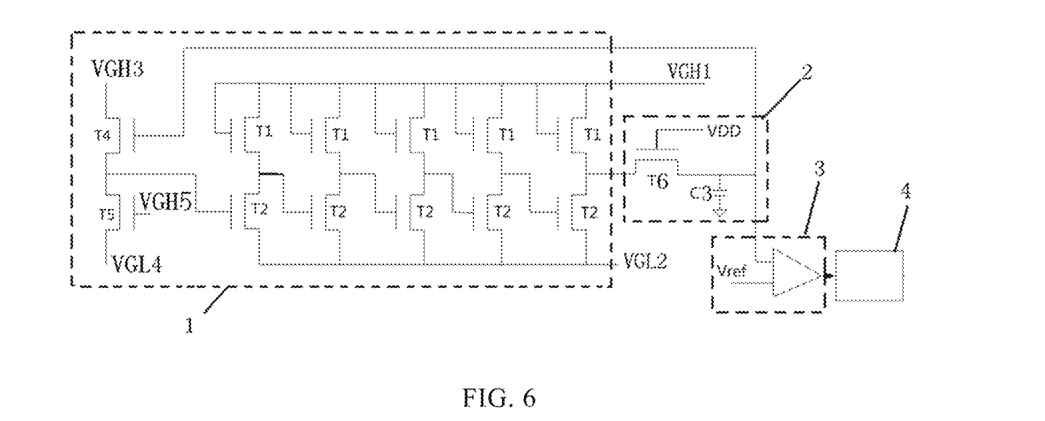

FIG. 6 is a schematic diagram illustrating a structure of a temperature sensor according to an embodiment of the present disclosure. As shown in FIG. 6, the oscillation starter circuit includes a fourth transistor T4 and a fifth transistor T5. A gate electrode of the fourth transistor T4 is coupled to the first input terminal of the comparator 3; a source electrode of the fourth transistor T4 is coupled to a third-level signal terminal VGH3, and a drain electrode of the fourth transistor T4 is coupled to the gate of the second transistor at the first stage and a source electrode of the fifth transistor T5. A drain electrode of the fifth transistor T5 is coupled to a fourth-level signal terminal VGL4, and a gate electrode of the fifth transistor T5 is coupled to a fifth-level signal terminal VGH5, where the third-level signal terminal VGH3 and the fifth-level signal terminal VGH5 each are at a high level.

Referring to FIG. 6, two TFTs, i.e., the fourth transistor T4 and the fifth transistor T5, are further provided in front of the ring oscillator 1. The leakage current characteristics, which is sensitive to the temperature, of the fifth transistor T5 is adjusted by controlling the gate voltage of the fifth transistor T5 according to the temperature characteristics of the TFT, thereby improving the oscillation starting performance of the ring oscillator 1. It should be noted that similar to the temperature sensor in FIG. 6, two TFTs can be added in front of the ring oscillator 1 in each of the temperature sensors of FIG. 2 to FIG. 5, so as to improve the oscillation starting performance of the ring oscillator 1.

Figure 7:
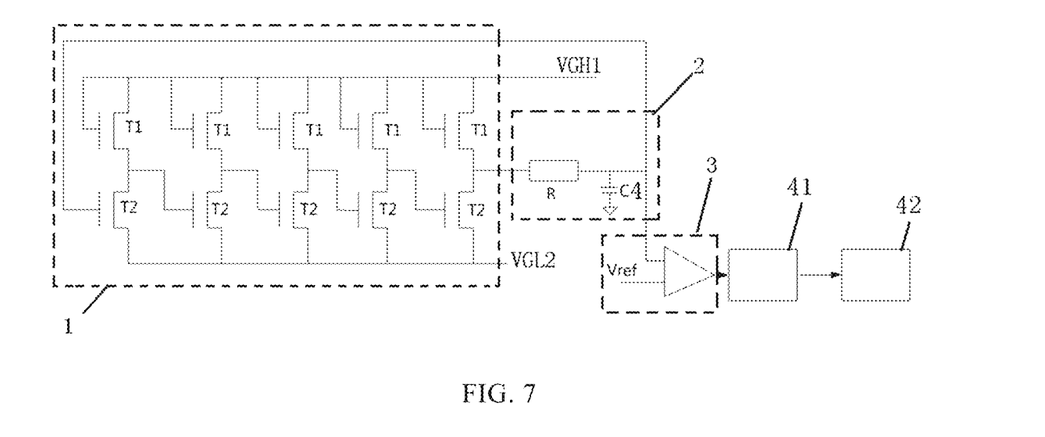

FIG. 7 is a schematic diagram illustrating a structure of a temperature sensor according to an embodiment of the present disclosure. As shown in FIG. 7, the signal converter 4 includes a buffer 41 and a digital signal processor 42. The buffer 41 is coupled to the comparator 3 and configured to convert a comparison square-wave signal output from the comparator 3 into an identifiable voltage signal. The digital signal processor 42 is coupled to the buffer 41 and configured to perform digital signal processing on the identifiable voltage signal output from the buffer 41, performing conversion on the processed signal, and outputting the temperature value. Specifically, the output oscillation frequencies of the temperature sensor obtained in a temperature test are normalized, and data for output oscillation frequencies of the temperature sensor at the standard temperatures are pre-stored (or stored in a database), so as to standardize and calibrate the temperature sensor of the present embodiment. In a case that the temperature is measured using the temperature sensor, the measured frequency is compared with the pre-stored data (or data in the database) so as to output a corresponding temperature value.

Referring to FIG. 7, after a square-wave signal output from the ring oscillator 1 passes through the low-pass filter 2, the filtered signal is input to the comparator 3 and compared with a pre-stored reference voltage Vref. And then, a square-wave signal is output from the comparator 3. The square-wave signal passes through the buffer 41 and is converted into a voltage that can be identified by the digital signal processor 42. The digital signal processor 42 performs digital signal processing on the voltage input thereto so as to realize the frequency test. The actually-measured temperature value is calculated by using a conversion formula.

Figure 8:
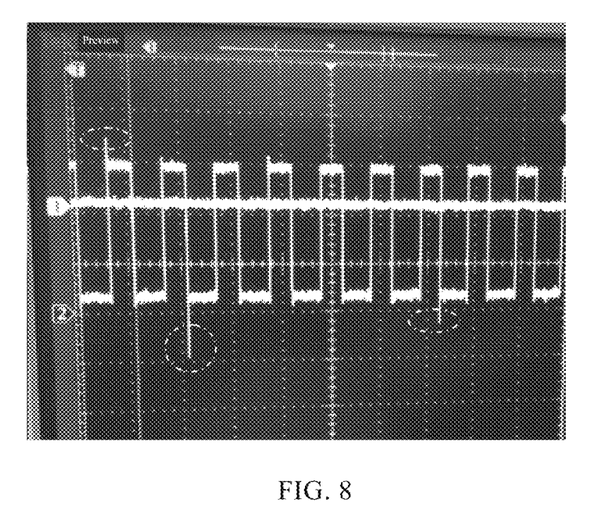
FIG. 8 is a waveform diagram illustrating a frequency signal acquired by a temperature sensor according to a comparative example.
Figure 9:
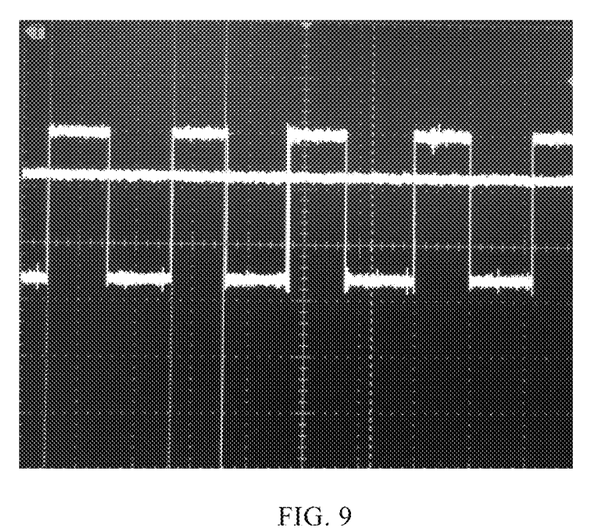
FIG. 9 is a waveform diagram illustrating a frequency signal acquired by a temperature sensor according to an embodiment of the present disclosure.

FIG. 9 is a waveform diagram illustrating of a frequency signal acquired by using the temperature sensor of the present embodiments. FIG. 8 is a waveform diagram illustrating a frequency signal acquired by a temperature sensor according to a comparative example in which no low-pass filter 2 is added. In FIG. 8, many portions surrounded by dotted lines are shown, which means that the interference is larger. Compared with FIG. 8, it can be seen from FIG. 9 that the waveform for the frequency signal is obviously better.

In an embodiment, an array substrate including the temperature sensor according to the above embodiment is provided. The array substrate includes a display region and a frame region at an edge of the display region. The temperature sensor is disposed in the frame region, and display transistors are disposed in the display region. The first transistors T1 and the second transistors T2 are formed when the display transistors are formed.

In an embodiment, a display device including the array substrate described above is provided. The display device may be any product or component having a display function, such as a liquid crystal display panel, an electronic paper, an OLED panel, a mobile phone, a tablet computer, a television, a display, a notebook computer, a digital photo frame, a navigator, and the like.

Obviously, various changes for the specific implementation of the foregoing embodiments can be made; for example, the transistors may be connected as needed, and the source and drain electrodes of the transistors may be arranged as needed.

It should be understood that the above embodiments are merely exemplary embodiments for the purpose of illustrating the principles of the present disclosure, but the present disclosure is not limited thereto. Various variations and improvements can be made by those skilled in the art without departing from the spirit and essence of the present disclosure, and these variations and improvements shall be considered to fall into the protection scope of the present disclosure.

What is claimed is:

1. A temperature sensor, comprising: a ring oscillator, a comparator, a low-pass filter disposed between the ring oscillator and the comparator, and a signal converter, wherein the ring oscillator is configured to output a square-wave signal;

the low-pass filter is configured to filter out a high-frequency component in the square-wave signal output from the ring oscillator and output the filtered square-wave signal to the comparator;

the comparator is configured to compare a filtered square-wave signal input to the comparator with a reference signal, and output a comparison square-wave signal; and the signal converter is coupled to the comparator and configured to convert the comparison square-wave signal output from the comparator into a temperature value, the ring oscillator comprises n stages, wherein n is an odd number greater than or equal to 5, each stage comprises a first oscillating transistor and a second oscillating transistor, at each stage of the ring oscillator, a gate electrode and a source electrode of the second oscillating transistor are coupled to a terminal supplying a high-level signal, and a drain electrode of the second oscillating transistor is coupled to a source electrode of the first oscillating transistor;

a gate electrode of the first oscillating transistor at a first stage of the ring oscillator is coupled to a first input terminal of the comparator, a gate electrode of the first oscillating transistor at each of remaining stages of the ring oscillator of the n stages of the ring oscillator other than the first stage of the ring oscillator is coupled to a source electrode of the first oscillating transistor at an immediately previous adjacent stage of the ring oscillator and a drain electrode of the second oscillating transistor at the immediately previous adjacent stage of the ring oscillator, and a drain electrode of the first oscillating transistor at each stage of the ring oscillator is coupled to a terminal supplying a low-level signal; and a source electrode of the first oscillating transistor at a $n^{th}$ stage of the ring oscillator and a drain electrode of the second oscillating transistor at the $n^{th}$ stage of the ring oscillator are coupled to an input terminal of the low-pass filter.

2. The temperature sensor according to claim 1, wherein the low-pass filter comprises a capacitor;

a first end of the capacitor is coupled to an output terminal of the ring oscillator and a first input terminal of the comparator; and a second end of the capacitor is grounded.

3. The temperature sensor according to claim 1, wherein the low-pass filter comprises a capacitor and a transistor;

a first end of the capacitor is coupled to a drain electrode of the transistor and a first input terminal of the comparator, and a second end of the capacitor is grounded; and a gate electrode of the transistor is coupled to a terminal supplying a high-level signal, and a source electrode of the transistor is coupled to an output terminal of the ring oscillator.

4. The temperature sensor according to claim 1, wherein the low-pass filter comprises a capacitor and a transistor;

a first end of the capacitor is coupled to a drain electrode of the transistor and a first input terminal of the comparator, and a second end of the capacitor is grounded; and a gate electrode of the transistor is coupled to a terminal supplying a nominal voltage, and a source electrode of the transistor is coupled to an output terminal of the ring oscillator.

5. The temperature sensor according to claim 1, wherein the low-pass filter comprises a capacitor and a resistor;

a first end of the capacitor is coupled to a second end of the resistor and a first input terminal of the comparator, and a second end of the capacitor is grounded; and a first end of the resistor is coupled to an output terminal of the ring oscillator.

6. The temperature sensor according to claim 1, wherein the low-pass filter comprises a capacitor;

a first end of the capacitor is coupled to the source electrode of the first oscillating transistor at the $n^{th}$ stage of ring oscillator, the drain electrode of the second oscillating transistor at the $n^{th}$ stage of ring oscillator and the first input terminal of the comparator; and a second end of the capacitor is grounded.

7. The temperature sensor according to claim 1, wherein the low-pass filter comprises a capacitor and a transistor;

a first end of the capacitor is coupled to a drain electrode of the transistor and the first input terminal of the comparator; and a second end of the capacitor is grounded; and a gate electrode of the transistor is coupled to a terminal supplying a high-level signal, and a source electrode of the transistor is coupled to the source electrode of the first oscillating transistor at the $n^{th}$ stage of ring oscillator and the drain electrode of the second oscillating transistor at the $n^{th}$ stage of ring oscillator.

8. The temperature sensor according to claim 1, wherein the low-pass filter comprises a capacitor and a transistor;

a first end of the capacitor is coupled to a drain electrode of the transistor and the first input terminal of the comparator, and a second end of the capacitor is grounded; and a gate electrode of the transistor is coupled to a terminal supplying a nominal voltage, and a source electrode of the transistor is coupled to the source electrode of the first oscillating transistor at the $n^{th}$ stage of ring oscillator and the drain electrode of the second oscillating transistor at the $n^{th}$ stage of ring oscillator.

9. The temperature sensor according to claim 1, wherein the low-pass filter comprises a capacitor and a resistor;

a first end of the capacitor is coupled to a second end of the resistor and the first input terminal of the comparator, and a second end of the capacitor is grounded; and a first end of the resistor is coupled to the source electrode of the first oscillating transistor at the $n^{th}$ stage of ring oscillator and the drain electrode of the second oscillating transistor at the $n^{th}$ stage of ring oscillator.

10. The temperature sensor according to claim 1, further comprising an oscillation starter circuit having a first oscillation starting transistor and a second first oscillation starting transistor, wherein a gate electrode of the first oscillation starting transistor is coupled to a first input terminal of the comparator, a source electrode of the first oscillation starting transistor is coupled to a terminal supplying a high-level signal, and a drain electrode of the first oscillation starting transistor is coupled to a gate electrode of the second oscillating transistor at the first stage of the ring oscillator and a source electrode of the second oscillation starting transistor; and a drain electrode of the second oscillation starting transistor is coupled to a terminal supplying a low-level signal, and a gate electrode of the second oscillation starting transistor is coupled to a terminal supplying a high-level signal.

11. The temperature sensor according to claim 1, wherein the signal converter comprises:

a buffer coupled to the comparator and configured to convert the comparison square-wave signal output from the comparator into an identifiable voltage signal; and a digital signal processor coupled to the buffer and configured to process the identifiable voltage signal output from the buffer and output the temperature value.

12. An array substrate comprising the temperature sensor according to claim 1, wherein the array substrate comprises a display region and a frame region at an edge of the display region, the temperature sensor is disposed in the frame region, and display transistors are disposed in the display region.

* * * * *